United States Patent [19]

Thornton et al.

[11] Patent Number: 4,802,182

[45] Date of Patent: Jan. 31, 1989

[54] MONOLITHIC TWO DIMENSIONAL WAVEGUIDE COUPLED CAVITY LASER/MODULATOR

[75] Inventors: Robert L. Thornton, East Palo Alto; Thomas L. Paoli, Los Altos, both of Calif.

[73] Assignee: Xerox Corporation, Stamford, Conn.

[21] Appl. No.: 117,706

[22] Filed: Nov. 5, 1987

[51] Int. Cl.$^4$ .......................... H01S 3/19; H01S 3/10
[52] U.S. Cl. ........................................ 372/50; 372/26; 372/45; 372/46
[58] Field of Search ...................... 372/50, 45, 46, 26

[56] References Cited

U.S. PATENT DOCUMENTS

| | | | |
|---|---|---|---|
| 4,028,146 | 6/1977 | Logan et al. | 372/45 |
| 4,136,928 | 1/1979 | Logan et al. | 372/50 |
| 4,558,449 | 12/1985 | Gordon | 372/26 |
| 4,594,603 | 6/1986 | Holonyak, Jr. | 372/46 |

OTHER PUBLICATIONS

Sham et al., "Monolithic Integration of GaAs (GaAl)As Light Modulators and Distributed-Bragg-Reflectors Lasers", Appl. Phys. Lett. 32(5), Mar. 1, 1978, pp. 314–316.
K. Wakita et al, "Long-Wavelength Waveguide Multiple Quantum Well (MQW) Optical Modulator with 30:1 On/Off Ratio", Electronic Letters, vol. 22(17), pp. 907–908 (Aug. 14, 1986).
Y. Kawamura et al, "Monolithic Integration of InGaAsP/InP DFB Lasers and InGaAs/InAlAs MQW Optical Modulators", Electronic Letters, vol. 22(5), pp. 242–243 (Feb. 27, 1986).
N. K. Dutta et al, "Integrated External Cavity Laser", Applied Physics Letters, vol. 49(19), pp. 1227–1229 (Nov. 19, 1986).
K. Meehan et al, "Disorder of an $Al_xGa_{1-x}As$–GaAs Superlattice by Donor Diffusion", Applied Physics Letters, vol. 45(5), pp. 649–651 (Sep. 1, 1984).
R. L. Thornton et al, "High Efficient, Long Lived AlGaAs Lasers Fabricated by Silicon Impurity Induced Disordering", Applied Physics Letters, vol. 49(3), pp. 133–134 (Jul. 21, 1966).
R. L. Thornton et al, "High Power (2.1W) 10-Stripe AlGaAs Laser Arrays with Si Disordered Facet Windows", Applied Physics Letters, vol. 49(23), pp. 1572–1574 (Dec. 8, 1986).
F. Julien et al, "Impurity-Induced Disorder-Delineated Optical Waveguides in GaAs-AlGaAs Superlattices", Applied Physics Letters, vol. 50(14), pp. 866–868 (Apr. 6, 1987).
J. Ungar et al, "High Power GaAlAs Window Lasers", Electronic Letters, vol. 22(5), pp. 279–280 (Feb. 27, 1986).

Primary Examiner—William L. Sikes
Assistant Examiner—Georgia Y. Epps
Attorney, Agent, or Firm—W. Douglas Carothers, Jr.

[57] ABSTRACT

A monolithic two dimensional waveguide coupled cavity laser/modulator structure for high speed modulation comprising a plurality of semiconductor layers on a semiconductor substrate. One of the semiconductor layers functions as an active region. Impurity induced disordering techniques are utilized to form first and second active mediums in the structure having co-axial two dimensional optical cavities. One of these active mediums functions as a laser and the other as a modulator. A passive two dimensional waveguide is integrally formed between the two active mediums having a highest refractive index at its core with diminishing refractive index omnidirectionally from its core with waveguide core having a energy bandgap level higher than both of the active mediums exhibiting low optical absorption at the gain wavelength of either of the active mediums. The modulator can be operated between an electro-absorption mode and a gain modulation mode while the laser is current pumped above threshold with the modulated optical switching of the output of said laser being less than 100 picoseconds as a function of applied voltage to said modulator varied in a range of 0 to 2 volts as illustrated by the curves in FIG. 14.

4 Claims, 12 Drawing Sheets

1

MONOLITHIC TWO DIMENSIONAL WAVEGUIDE COUPLED CAVITY LASER/MODULATOR

CROSS-REFERENCE TO RELATED APPLICATIONS

This application contains subject matter related to the subject matter of patent application Ser. No. 117,777, filed Nov. 5, 1987 and assigned to the same assignee herein.

BACKGROUND OF THE INVENTION

This invention relates to monolithic laser/modulator devices and more particularly to a monolithic laser/-modulator coupled via a low loss, two dimensional transparent waveguide.

High speed optical molulators are of great interest because of their use in high bit rate optical communication systems. It is necessary that such a modulator be substantially void of wavelength chirping under conditions of high speed modulation, such as above 1 Gbit per second because wavelength chirping will bring about a dispersion of the power and create a noise level that is unacceptable for successful high bit operation. See the article of K. Wakita et al, entitled "Long-Wavelength Waveguide Multiple Quantum Well (MQW) Optical Modulator With 30:1 On/Off Ratio", *Electronic Letters*, Vol. 22(17), pp. 907–908, Aug. 14, 1986.

It is desired that for improved operation that these optical modulators be monolithically integrated with laser sources as exemplified in the article of Y. Kawamura et al, entitled "Monolithic Integration of InGaAsP/InP DFB Lasers and InGaAs/InAlAs MQW Optical Modulators", *Electronic Letters*, Vol. 22(5), pp. 242–243, Feb. 27, 1986. However, these monolithic integrated laser modulators involve separate, sequential growth processes and the introduction of unacceptable levels of propagation, absorption and scattering losses.

What is needed is a concurrent as-grown monolithic integration of such optoelectronic devices utilizing means by which these losses can be substantially reduced to levels to provide a commercially acceptable high speed optical laser modulator for high speed modulation. Such integration of active laser sources with modulators is an important capability for the realization of advanced optoelectronics involving on-chip optical communication and, in particular, reducing the levels of absorption loss, and optical scattering and reflection losses at the coupling interface between the integrated active laser source and modulator and, further, providing an integrated waveguide that is transparent at the emission wavelength of the integrated laser source. These features have not been present in such monolithic optoelectronic devices as successfully reproducible capability up to this point in time.

One manner of forming a coupling interface between a passive waveguide and an active medium has been accomplished by evanescently coupling of a transparent passive waveguide formed adjacent and parallel to the waveguide of the active medium. As example of this type of coupling is found in the article of N. K. Dutta et al. entitled, "Integrated External Cavity Laser", *Applied Physics Letters*, Vol. 49(19), pp. 1227–1219, Nov. 10, 1986. However, such a coupling mechanism has considerable coupling loss and scattering at the transition between the active medium and the transparent waveguide. It is also preferred that the active medium and the transparent waveguide were integrally coupled in co-axial alignment, i.e., are at least co-extensive at the point of coupling.

In recent years, the technique of impurity induced disordering (IID) has been developed as a means for crafting semiconductor structures, which technique may be defined as a process of enhanced rate of interdiffusion of ordered elemental constituents as initially formed in consecutively deposited layers of semiconductor compounds or alloys through the introduction, i.e., diffusion, of an impurity into the layers. The utility of IID, as discussed in K. Meehan et al, "Disorder of an $Al_xGa_{1-x}As$-GaAs Superlattice by Donor Diffusion", *Applied Physics Letters*, Vol. 45(5) pp. 649–651, Sept. 1, 1984 and in U.S. Pat. No. 4,639,275, has been demonstrated in the fabrication of buried heterostructure lasers, as per the article of R. L. Thornton et al entitled, "High Efficient, Long Lived AlGaAs Lasers Fabricated by Silicon Impurity Induced Disordering", *Applied Physics Letters*, Vol. 49(3), pp. 133–134, July 21, 1966. Also, it has been previously shown that IID can be employed to fabricate a planar, transparent one dimensional passive waveguide for a window laser as demonstrated in the article of R. L. Thornton et al entitled, "High Power (2.1)W) 10-Stripe AlGaAs Laser arrays With Si Disordered facet Windows", *Applied Physics Letters*, Vol. 49(23), pp. 1572–1574, Dec. 8, 1986. However, as the laser emission aperture is made narrower, as is desirable for a low threshold buried heterostructure laser, the diffraction losses in the waveguide window will increase. Thus, what is necessary is to either cleave the device so that the window region is only a few microns long in order to best compromise low threshold against diffraction losses or, alternatively, fabricate an efficient buried two dimensional passive, transparent waveguide in the window region. The former is difficult to manifest in a reproducible manner, leaving the latter as the best alternative for improving the propagation efficiency and coupling of buried transparent waveguides.

There has been work studying the optical waveguide properties of two dimensional passive waveguides fabricated by IID as, for example, the article of F. Julien et al, "Impurity-Induced Disorder-Delineated Optical Waveguides in GaAs-AlGaAs Superlattices", *Applied Physics Letters*, Vol. 50(14), pp. 866–868, Apr. 6, 1987. However, these waveguides exhibit high propagation loss at the emission wavelength of a laser fabricated in the same set of epitaxial layers.

A principal object of this invention is the provision of a monolithic laser/modulator that has a modulator section and an amplifying section coupled by a low loss, two dimensional transparent waveguide, that provides low propagation loss, low scattering loss and low optical absorption at the gain wavelength of the active medium providing output light pulses significantly narrower than 100ps.

SUMMARY OF THE INVENTION

According to this invention, a monolithic two dimensional waveguide coupled cavity laser/modulator structure for high speed modulation comprises a plurality of semiconductor layers on a semiconductor substrate wherein one of the semiconductor layers functions as an active region. Impurity induced disordering techniques are utilized to form first and second active mediums in the structure having co-axial two dimensional optical cavities. One of these active mediums functions as a laser and the other as a modulator. A passive two dimensional waveguide is integrally formed between the two active mediums having a highest refractive index at its core with diminishing refractive index omnidirectionally from its core with waveguide core having a energy bandgap level higher than both of the active mediums exhibiting low optical absorption at the gain wavelength of either of the active mediums. The modulator can be operated between an electro-absorption mode and a gain modulation mode while the laser is current pumped above threshold with the modulated optical switching of the output of said laser being less than 100 picoseconds as a function of applied voltage to said modulator varied in a range of 0 to 2 volts as illustrated by the curves in FIG. 14.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

The center of focus of patent application Ser. No. 117,777 supra, is the capability of fabricating low loss buried two dimensional passive waveguides integrated with other optoelectronic devices and structures on a single monolithic chip to effectively bring about low propagation losses in on-chip optical communication and waveguiding. For the purposes of illustration and understanding the monolithic laser/modulator of this invention, the buried passive waveguide disclosed in patent application Ser. No. 117,777 will be initially discussed with particular reference to a single stripe window laser structure.

Figure 1:
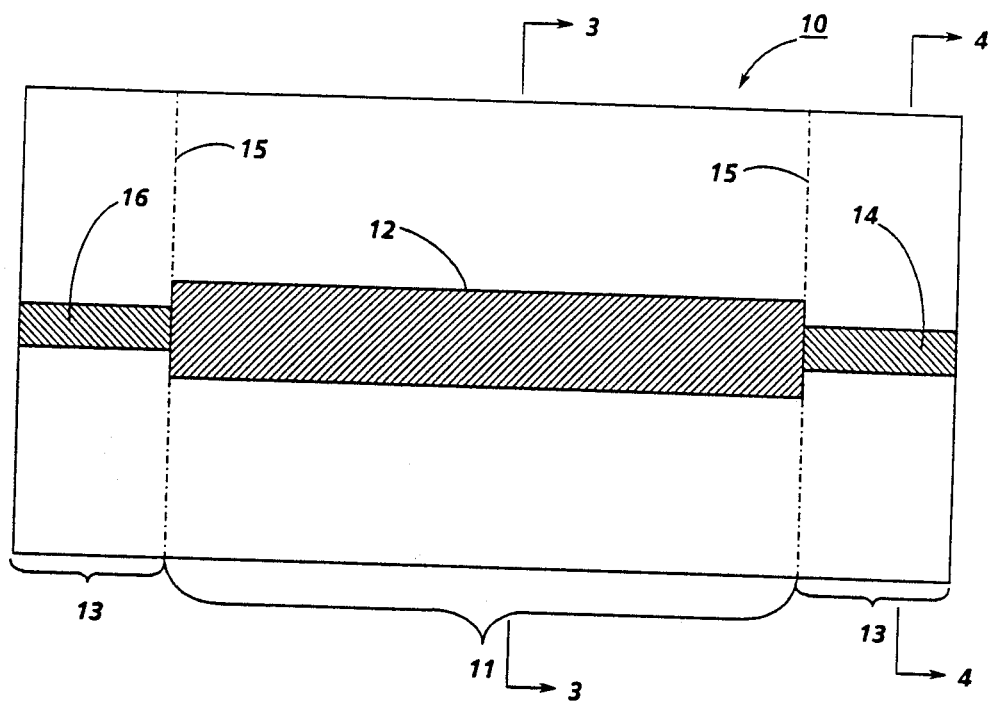
FIG. 1 is a schematic elevation of an optoelectronic structure for the purposes of illustrating an application of a low loss buried planar optical passive waveguide.
Figure 2:
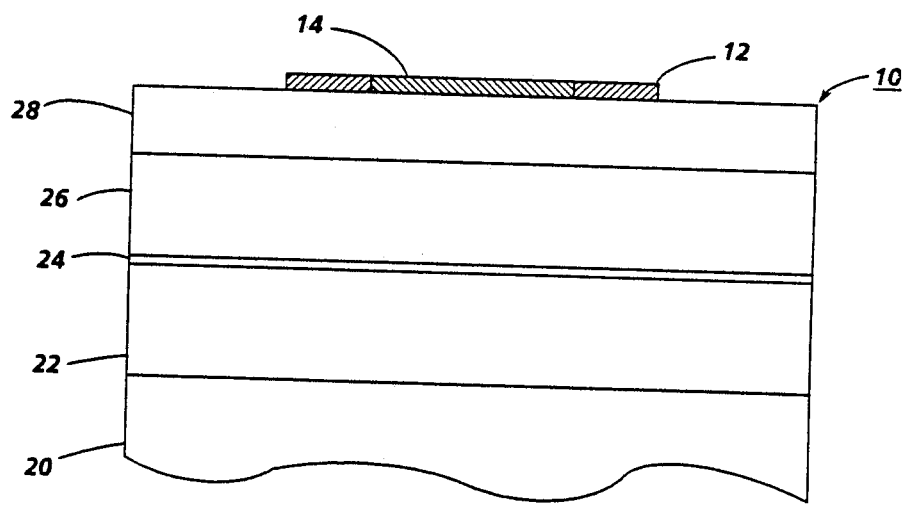
FIG. 2 is a schematic end view before selective IID treatment of the structure shown in FIG. 1.
Figure 6:
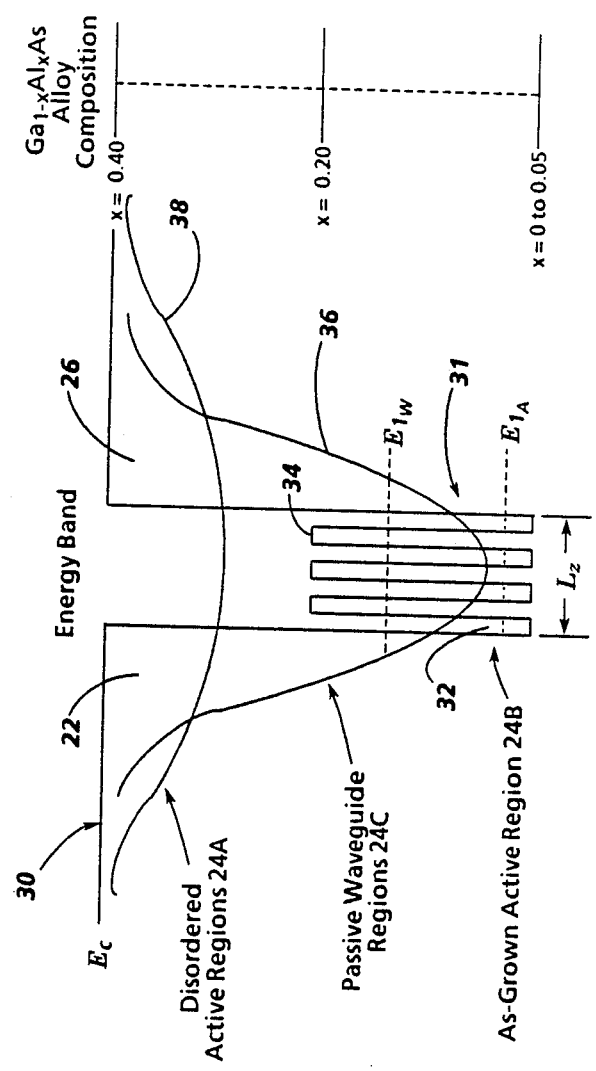
FIG. 6 is an illustration of the energy conduction band profile as well as the allow compositional variation across the active region of the structure shown in FIGS. 1 and 2 both as grown and after selective IID treatment at lines 3—3 and 4—4 in FIG. 1.

Referring now to FIGS. 1 and 2, there is illustrated an enlarged view of a semiconductor structure 10 comprising a plurality of epitaxially deposited layers 22-28 on substrate 20. As an example of a semiconductor structure 10 is a semiconductor heterostructure comprising a central section 11, which may be an active medium, and a pair of passive waveguide sections 13. Structure 10 may include a substrate 20, which may be comprised of n-GaAs, on which are consecutively deposited in an MO-CVD reactor epitaxial layers 22-28, as is known in the art. These epitaxially deposited layers may be, for example, as follows: Cladding layer 22 of n-$Ga_{1-y}Al_yAs$ wherein, for example, y=0.40; active region 24 comprising a layer of GaAs or $Ga_{1-x}Al_xAs$ where y>x, or a single quantum well layer of GaAs or a multiple quantum well of alternating layers of GaAs and $Ga_{1-x}Al_xAs$ or alternating layers of $Ga_{1-x}Al_xAs$ and $Ga_{1-z}Al_zAs$ where y>z>x; cladding layer 26 of p-$Ga_{1-y}Al_yAs$ and a cap layer 28 of p+GaAs. In the particular example here, active region 24 comprises a multiple quantum wells, i.e., a superlattice, the energy conduction band profile 30 and alloy compositional profile of which are illustrated in FIG. 6. This superlattice is comprised of four 12nm quantum wells 32 of $Ga_{1-x}Al_xAs$, wherein x=0.05, separated by three 6 nm barriers 34 of $Ga_{1-z}Al_zAs$, wherein z=0.20. Therefore, the superlattice has a width, $L_z$, of approximately 66 nm.

Upon the completion of growth of these epitaxial layers and before removal from the MO-CVD reactor, a mask layer (not shown in full) is deposited on cap layer 28. This mask layer may be, for example, $Si_3N_4$. Structure 10 is then removed from the MO-CVD reactor to selectively etch a pattern in the mask layer, the pattern taking on the form of mask portions 12, 14, and 16 illustrated in FIG. 1. As a particular example, mask portion 12 may be typically about 4 μm wide and mask portions 14 and 16 may be typically about 2 μm wide. However, the width dimensions of these mask portions are chosen in a manner as follows: (1) the wider dimension of mask portion 12 is chosen to determine the width of the pumping stripe for the active optical cavity of medium 11 and (2) the narrower dimension of mask portions 14 and 16 are chosen to be sufficiently narrow to achieve some degree of IID substantially into if not throughout its active region portion beneath the mask such that central core of its active region 24 is less completely interdiffused by the IID process as compared to adjacent disordered "wing" regions of active region 24 outside this central portion and not fully protected by mask portions 14 or 16.

Structure 10 is, next, returned to the MO-CVD reactor for the deposition of a bilayer composite source (not shown) over the established mask pattern portions 12, 14 and 16 and exposed portions of cap layer 28. The bilayer composite source comprises an impurity source layer, e.g., polycrystalline Si, heavily doped with a diffusion enabling agent, e.g., As, followed by a passivating layer, which may, for example, be of the same material as the original mask layer, i.e., $Si_3N_4$. The technique of deposition and employment of this bilayer composite source are set forth and taught in patent applications Ser. No. 117,593 and Ser. No. 117,596, filed concurrently with this application and assigned to the same assignee herein, which applications are incorporated herein by reference thereto. FIGS. 1 and 2 accurately represent this stage of process of structure 10.

Figure 3:
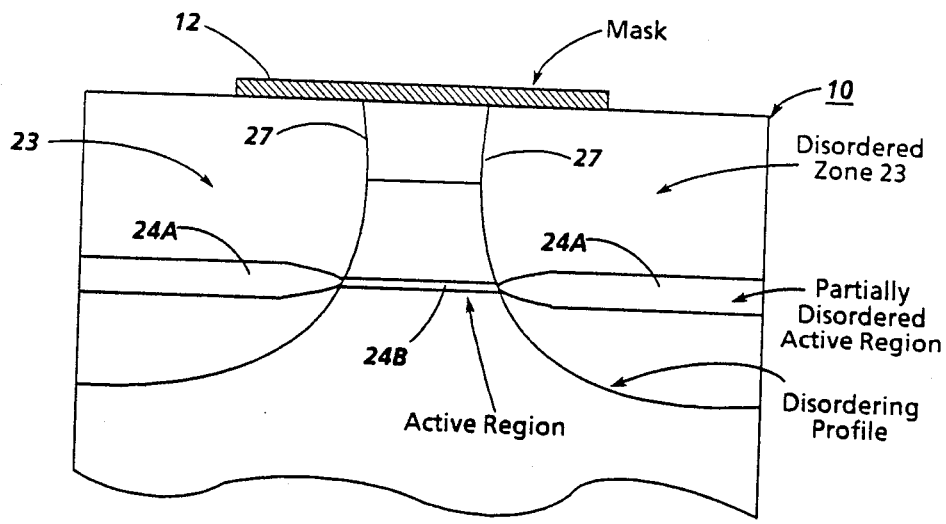
FIG. 3 is a cross sectional schematic representation of the diffusion profile along the line 3—3 in FIG. 1 after selective IID treatment.
Figure 4:
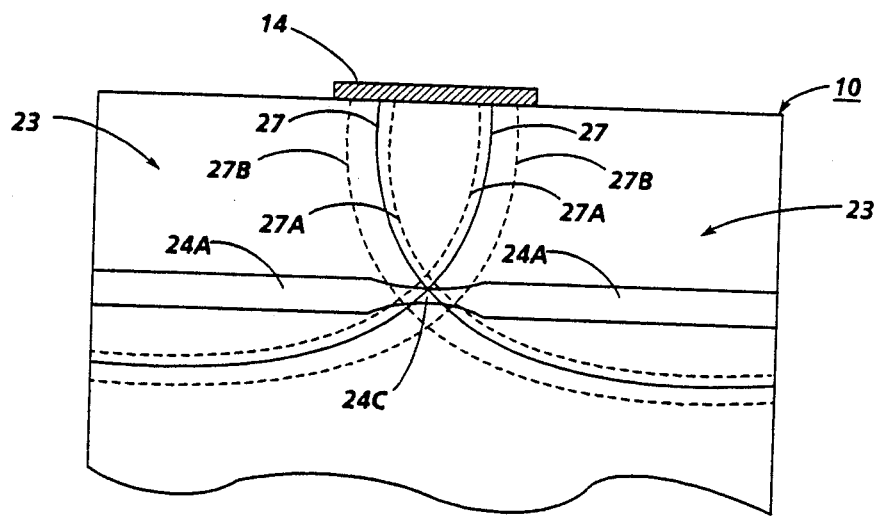
FIG. 4 is a cross sectional schematic representation of the diffusion profile along the line 4—4 in FIG. 1 after selective IID treatment.

Upon growth of the bilayer composite source, structure 10 is removed from the MO-CVD reactor and placed in a heat treating oven to perform an anneal, e.g. for a period of 8-10 hours at 850° C., to bring about selective disordering of structure 10, the progression or extent of which is illustrated by disordering profile 27 illustrated in FIGS. 3 and 4. The character and extent of profile 27 beneath each mask pattern portion 12, 14 and 16 is not only a function of the width of mask portions 12, 14 and 16 but also a function of the thickness and distance of depth of layers 24, 26 and 28 and the temperature and time of annealing. The diffusion gradient profile 27 of FIGS. 3 and 4 is accurate for mask portion 12 having a width of 4 μm and mask portions 14 and 16 each having a width of 4 μm with annealing accomplished at 850° C. for about 10 hours. These solid profile lines represent the extent of the ordered/disordered gradients that has occurred during the annealing process. Regions 24A represent, for example, the extent of sufficient Si concentration, i.e., [Si], having reached a predetermined ordered/disordered transition level to provide an enhanced rate of interdiffusion of Ga and Al atoms among the heterostructure layers 22, 26, 32 and 34. A relatively high concentration of impurity species is required to bring about this interdiffusion enhancement. This higher mobility concentration for Si, $[Si]_{Min}$, initiates approximately around $1.5 \times 10^{18}/cm^3$ to $3 \times 10^{18}/cm^3$ for Si and for $[Zn]_{Min}$ approximately around $1-3 \times 10^{19}/cm^3$. In other words, there is a remarkably increased mobility of the interdiffusion of Ga and Al atoms when the $[Si] \approx [Si]_{Min}$ in the regions of immediate disordering.

Figure 7:
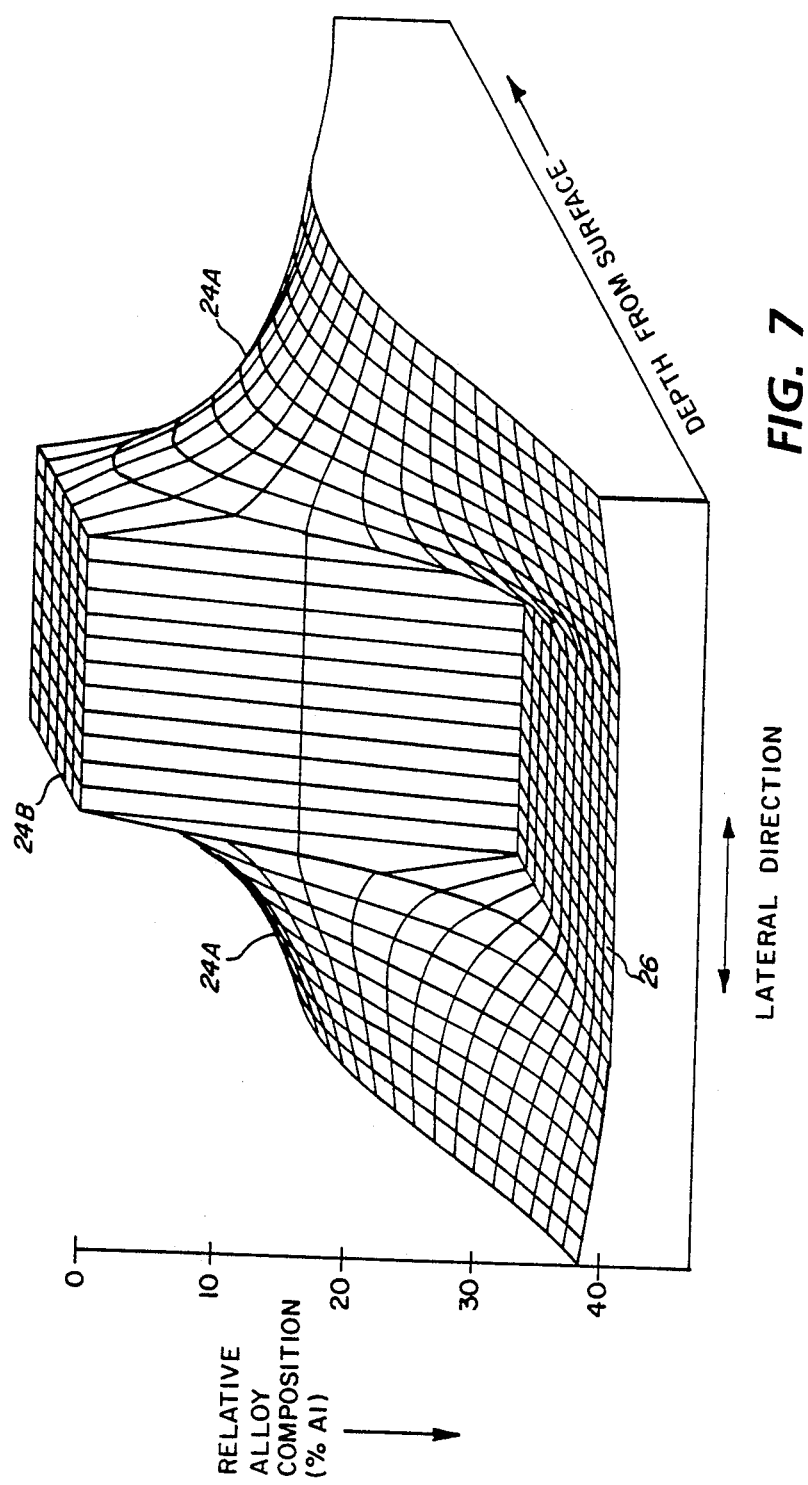
FIG. 7 is a three dimensional profile representation of the relative alloy composition of a portion of the cross sectional schematic representation of FIG. 3.
Figure 8:
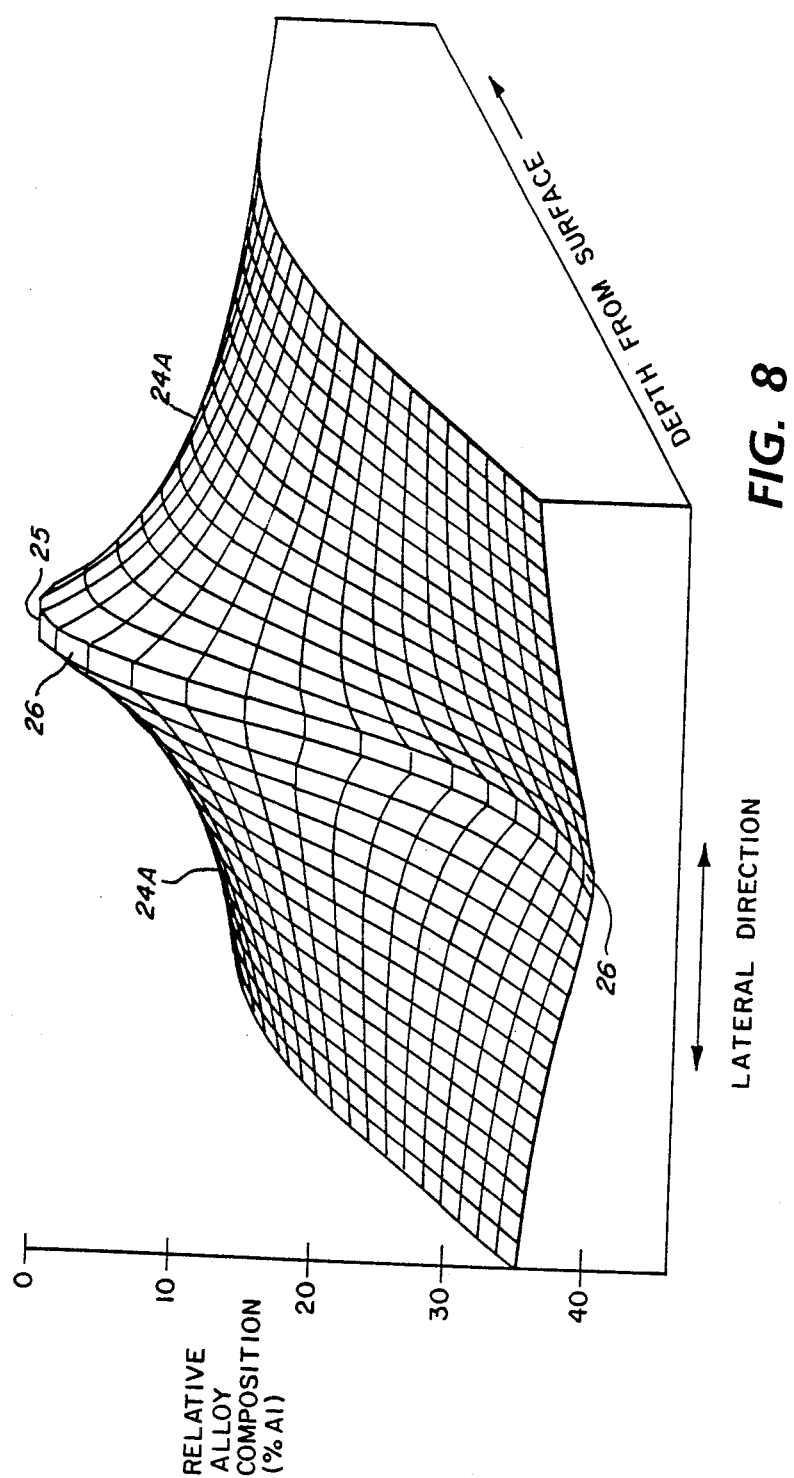
FIG. 8 is a three dimensional profile representation of the relative alloy composition of a portion of the cross sectional schematic representation of FIG. 4.

FIGS. 7 and 8 are three dimensional representations of the diffusion gradient profiles for structure 10 respectively at line 3—3 and 4—4 in FIG. 1 as measured with respect to relative alloy composition, i.e., % Al in the GaAlAs.

The profiles in FIGS. 3 and 4 represent the diffusion front and also a p-n junction, since layers 26 and 28 are p type and the diffusion of Si functions as a n type dopant. However, the diffusion front, as represented by profiles 27 in FIGS. 3 and 4, is believed not to be an absolute ordered/disordered transitional demarcation but rather has a diffusion gradient extending forward as well as rearward of profiles 27. Thus, the desired profile 27 in forming the passive waveguide regions 24C fall within a range of possible diffusion profiles represented by the spacing between dotted line profiles 27A and 27B in FIG. 4. Where the diffusion profile 27 may fall within this range is not critical because the forward and leeward diffusion gradient of the diffusion profile is effective, per se, to cause initial or partial disordering in active region 24C. What is important is that there occur at least some initial interdiffusion of elemental constituents, i.e., Al atoms present in cladding layers 22 and 26 as well as present in barriers 34 become mobile due to the level of $[Si]_{Min}$ to effectively change the original lowest energy level, $E_{1W}$, of region 24C to a new higher level, $E_{1A}$, as illustrated in FIG. 6. As a result, region 24C will be transparent to radiation generated in medium 11, i.e., passive waveguide regions 24C in portions 13 will be nonabsorbing of radiation at the operating wavelength of active medium 11.

The waveguiding strength of passive waveguide region 24C of waveguide sections 13 may be varied by changing the length of time of IID and thereby fine tune its refractive index properties for preferred modal operation of active mmedium 11.

Figure 5:
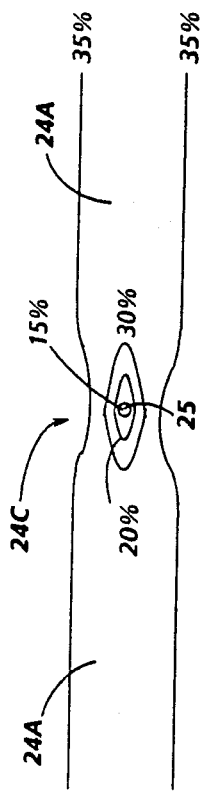
FIG. 5 is an enlarged view of the diffusion profile in the central core region of the IID formed passive waveguide of FIG. 4.

An important aspect of partially disordered region 24C is that there results in this region an Al content profile having the lowest Al content at center or core 25, as illustrated in the compositional cross sectional, topographical illustration of FIG. 5 and best in the three dimensional representation of FIG. 8. The compositional per cent profile lines of FIG. 5 represent the cross sectional gradient of Al content in region 24C due to disordering. The lowest point of Al content is at core 25 and monotonically increases in Al content outwardly in all directions from core 25 through active region 24 and into layers 22 and 26 and wing disordered regions 24A. A monotonical increase in Al content corresponds to a monotonical decrease in refractive index so that the highest refractive index is at core 25 and thence decreases in all radial directions from core 25. As a result, core 25 functions as the center of a two dimensional refractive index waveguide in region 24C.

FIG. 6 demonstrates how passive waveguide region 24C in waveguide portions 13 functions as a transparent waveguide for active region 24B in active medium 11. Active region 24B in medium 11 remains in its originally ordered form, as illustrated at 31 in FIG. 6 for energy profile 30, and, as previously indicated, represents the lowest order energy level at $E_{1A}$. As previously indicated, regions 24C in portions 13 have been partially disordered so that the energy conduction band profile, originally the same as profile 30 has changed to energy profile 36 with its lowest order energy level now at $E_{1W}$ so that $E_{1W} > E_{1A}$. Energy profile 38 represents the wing disordered regions 24A in FIGS. 3 and 4, which have a high level of disordering due to longer exposure to the IID process, since these regions are beyond and just beneath the edges of the protective mask portions 12, 14 and 16.

With the appropriate metal contacting of active medium 11, as is well known in the art, active pumping of medium 11 will produce radiation due to carrier recombination in area of active region 24B and, further, lasing action due to photon radiative recombination and resulting radiation propagation in the buried optical waveguide cavity of medium 11 formed by cladding layer 22 and higher refractive index changes brought about via diffusion profiles 27. The propagating radiation will be smoothly waveguided into the integral co-axial, transparent waveguide regions 24C of unpumped sections 13, which regions will be nonabsorbing at the radiative wavelength of medium 11.

An examination was made relative to the effectiveness of incorporating in a structure 10, two dimensional passive waveguide regions 24C to the structure facets, in combination with an active medium 11 functioning as a buried heterostructure laser. The bottom surface of substrate 20 and active medium section 11 are properly metal contacted, as is well known in the art, for current pumping but waveguide sections 13 are prior proton bombarded to render these regions insulating and, therefore, are not electrically pumped.

For comparison purposes, single stripe buried heterostructure lasers with conventional one dimensional waveguides to the facet were fabricated having the same structure as shown for gain guided array lasers disclosed in the article of R. L. Thornton et al entitled, "High Power (2.1)W) 10-Stripe AlGaAs Laser arrays With Si Disordered facet Windows", supra. As is well known in the art, the lack of two dimensional waveguiding in such cases necessitates keeping the window regions of the laser only a few microns in extent, as recognized in the article of J. Ungar et al entitled, "High Power GaAlAs Window Lasers", *Electronic Letters*, Vol. 22(5), pp. 279-280, Feb. 27, 1986; otherwise, the device efficiency is compromised. In both structures with and without the two dimensional waveguide, proton bombardment isolation is used to insure that current is injected only in the regions of the crystal structure that contain nondisordered, as-grown active region 24B.

Figure 9A:
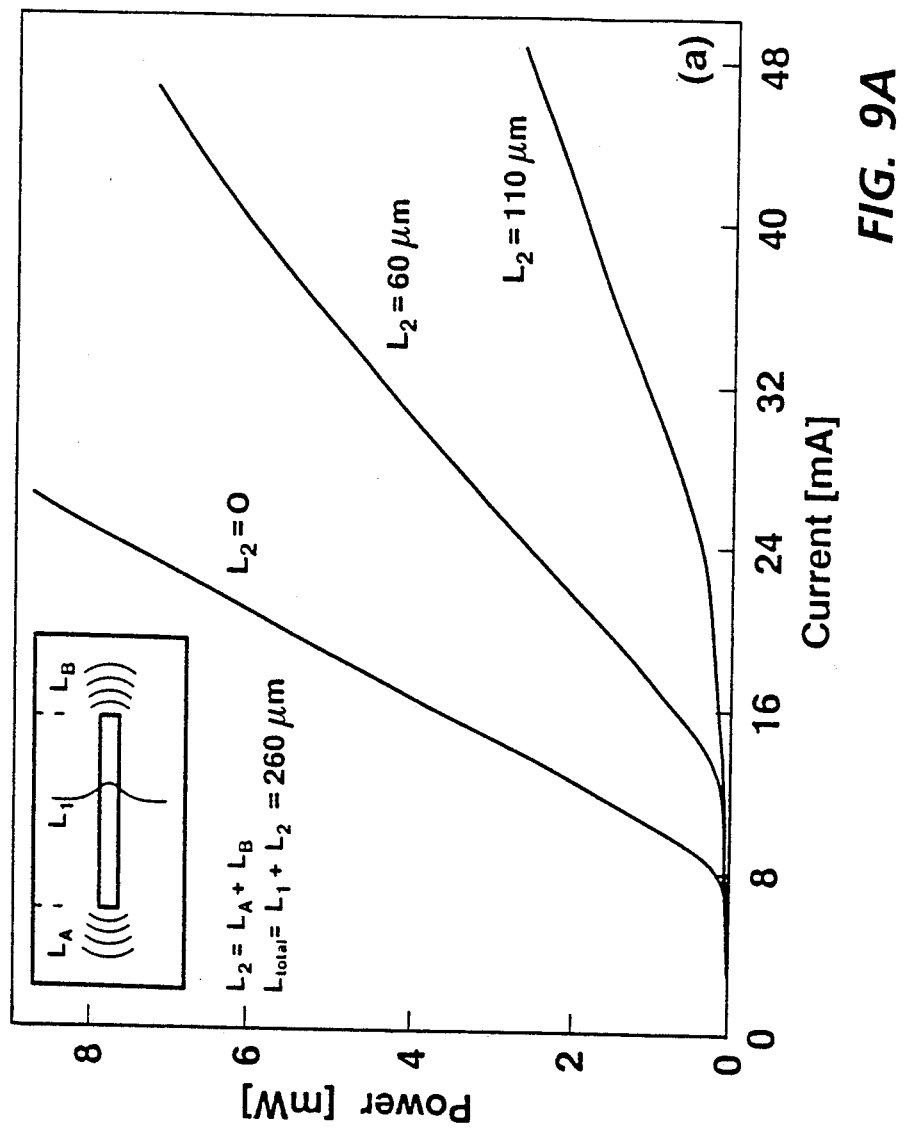
FIGS. 9A and 9B are graphic illustrations of the pulsed power versus current characteristics for a window laser fabricated conventionally without the two dimensional passive waveguiding of this invention (FIG. 9A) and fabricated with the two dimensional passive waveguiding of this invention (FIG. 9B) using the basic buried heterostructure of the type disclosed in FIGS. 3 and 4.
Figure 9B:
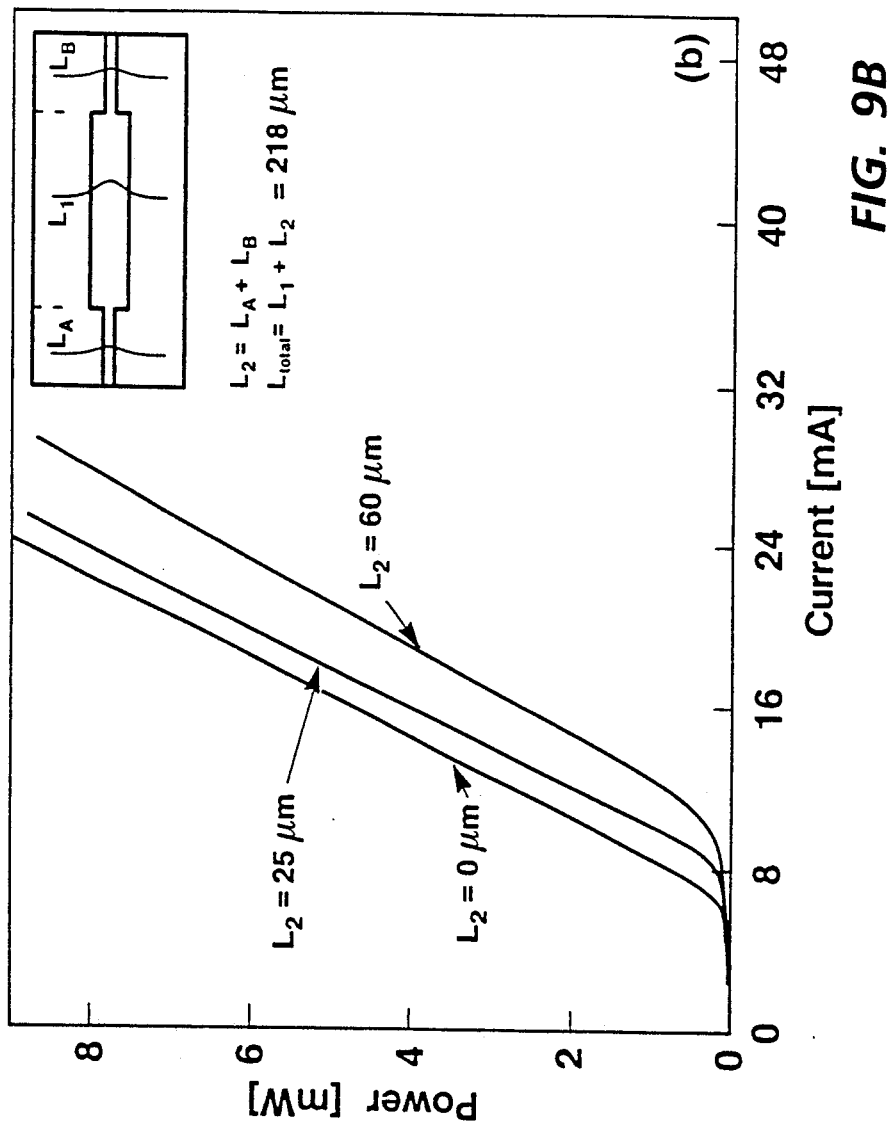

The effectiveness of two dimensional waveguiding is clearly demonstrated in the output versus current curves of FIGS. 9A and 9B. FIG. 9A shows the characteristics for lasers with increasing window lengths, $L_A+L_B$, in the one dimensional waveguide regions, while FIG. 9B shows the characteristics for lasers with increasing lengths, $L_A+L_B$, in the two dimensional waveguide regions. The insets in these two Figures illustrate these device geometries for comparison purposes so that the insert of FIG. 9A relates to devices having the one dimensional window regions, whereas the inset of FIG. 9B relates to devices with two dimensional waveguide regions 24C.

The dramatically reduced dependence of slope efficiency and threshold for the devices illustrated in FIG. 9B over devices without the two dimensional waveguiding illustrated in FIG. 9A is an indication that the diffraction and scattering losses in the two dimensional waveguide case are low. Also, the only slight increase in threshold with increasing length of unpumped region in the case of two dimensional waveguide is an indication, in addition, that the propagation loss in waveguide regions 24C is also low. Since, as previously mentioned, the waveguide regions are proton bombarded and therefore not electrically pumped, the expectation would be that considerable absorption in waveguide regions 24C would occur if these regions did not, in fact, consist entirely of material with wider bandgap than the as-grown active region and, therefore function with thresholds higher than those demonstrated for the devices of FIG. 9A. However, this is not the case.

As approximation of the magnitudes of both the scattering loss at the active medium/waveguide region transitions 15 between medium 11 and sections 13 and the propagation loss in waveguide regions 24C can be developed. To begin with, an assumption is made that the propagation constant in the pumped regions has only two components: a constant loss component and a ggain component proportional to the current density in the device. The propagation loss can be represented as follows:

$$\alpha = \alpha_1 + BI_{th}/L_1W$$

where $\alpha_1$ is the propagation loss in active medium 11, $J=I_{th}/L_1W$ is the current density in the device at threshold current $I_{th}$, W is the width of the active region stripe, B is the linear current/gain coefficient, and $L_1$ is the length of actively pumped medium 11 of the device. Making this assumption, the laser oscillation condition can be identified as follows:

$$-2\alpha_1L_1+2\alpha_2L_2+2N(\ln S)+2BI_{th}/W = -\ln(R_1R_2)$$

where $\alpha_2$ is the propagation loss in waveguide regions 24C, $L_2$ is the length of waveguide regions 24C, S is the power scattered out of the waveguide at a active medium/waveguide transition 15, N is the number of active medium/waveguide transitions 15 in a device, and $R_1$ and $R_2$ are the reflectivities at the two facets of the device. It is assumed that the lasing mode is determined by the reflections from the cleaved facets, even though there will be some reflection at active medium/waveguide transitions 15.

By using four devices to obtain four equations involving the four unknowns, $\alpha_1$, $\alpha_2$, S and B, above, approximations for scattering losses can be determined and are found to be in the range of $S \approx 7\%$, and the waveguide propagation loss to be on the order of $\alpha_1 \approx 10 \text{cm}^{-1}$. The propagation loss is of an appropriate magnitude to be consistent with free carrier absorption in the approximately $7 \times 10^{18}$ n-type disordered waveguide regions 24C, but is too low to be consistent with band to band absorption if the lasing photon energy were higher than the bandgap of the alloy composition of the waveguide, and the waveguide region were not electrically pumped. The conclusion, therefore, is that the propagation loss is indeed free carrier absorption in a wide bandgap alloy of waveguide regions 24C that is substantially transparent at the lasing energy of medium 11.

In conclusion, passive waveguide regions 24C are unique in that they can be fabricated in a monolithic and planar fashion and provide subsurface passive waveguide structures that are easily made coplanar and co-axial with buried gain regions or active mediums. The fact that optical gain mediums are readily available to amplify signals will greatly ease the constraint on tolerable levels of propagation loss, as evidenced by the data of FIG. 9B compared to FIG. 9A. As a result, semiconductor structures incorporating these two dimensional passive waveguides are of great interest in monolithic integration of optical and electronic components on a single chip.

Reference is now made to FIGS. 10–13 wherein there is shown structure 40 comprising a combination of active medium sections 42 and 44 coupled by a two dimensional passive waveguide section 46 which is the subject matter of this invention. Structure 40 was grown by MO-CVD in the same manner as structure 10 except that the geometry of the mask layer has been changed such that there are two active medium sections 42 and 44 instead of one and there is one passive waveguide section 46 co-axially coupling these two sections together.

Figure 11:
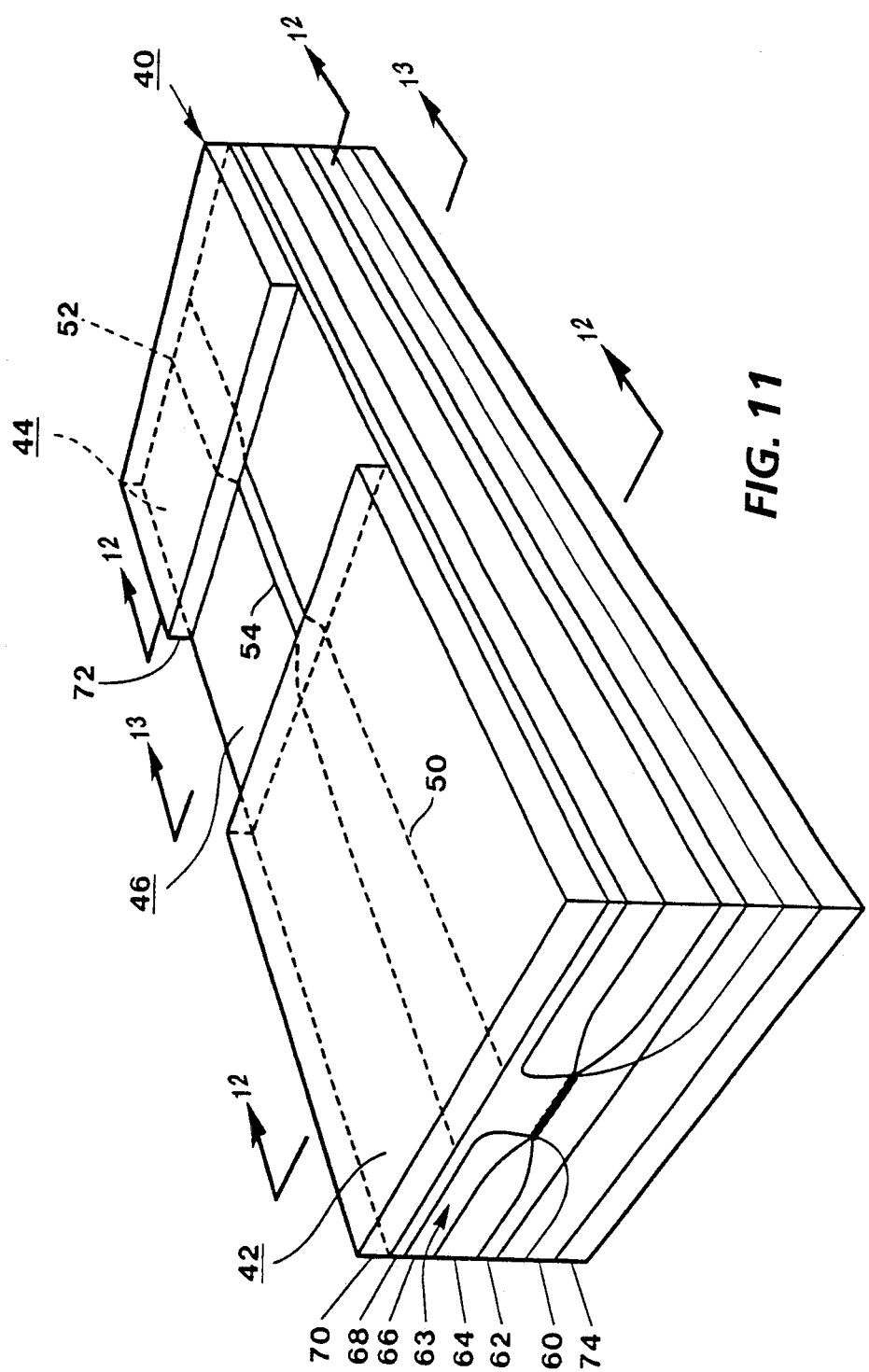
FIG. 11 is a schematic perspective view of the monolithic laser/modulator of FIG. 10 illustrating the amplifier/modulator illustrating coupling by a low loss buried co-axial passive waveguide.

Structure 40 is a semiconductor heterostructure comprising a pair of active medium sections 42 and 44, which are to function, respectively, as an amplifier or laser and a modulator, coupled by a two dimensional transparent waveguide section 46. In the example here, the respective lengths of the amplifier, waveguide and modulator sections 42, 44 and 46 may be, for example, 233 $\mu$m, 50 $\mu$m, and 47 $\mu$m. As best shown in FIG. 11, structure 40 includes a substrate 60 of n-GaAs, on which are consecutively deposited epitaxial layers 62–68. These epitaxially deposited layers may be, for example, as follows: Cladding layer 62 of n-Ga$_{1-y}$Al$_y$As wherein, for example, y=0.40; active region 64 comprising a layer of GaAs or Ga$_{1-x}$Al$_x$As where y>x, or a single quantum well layer of GaAs or a multiple quantum well of alternating layers of GaAs and Ga$_{1-x}$Al$_x$As or alternating layers of Ga$_{1-x}$Al$_x$As and Ga$_{1-z}$Al$_z$As where y>z>x; cladding layer 66 of p-Ga$_{1-y}$Al$_y$As and a cap layer 68 of p+GaAs. As in the case of structure 10, active region 64 in the particular example here comprises a superlattice, the energy conduction band profile 30 of which is shown in FIG. 4. This superlattice comprises four 12 nm quantum wells of Ga$_{1-x}$Al$_x$As, wherein x=0.05, separated by three 6 nm barriers of Ga$_{1-z}$Al$_z$As, wherein z=0.20.

Upon the completion of growth of these epitaxial layers, a Si$_3$N$_4$ mask layer is deposited on cap layer 68. Structure 40 is then removed from the MO-CVD reactor to selectively etch a pattern in the mask layer, the pattern taking on the form of mask portions 50, 52, and 54 illustrated in FIG. 10. Mask portions 50 and 52 may be about 4 $\mu$m wide and mask portion 54 may be about 2 $\mu$m wide. As previously indicated, the width dimensions of these mask portions are chosen in a manner that the wider dimension of mask portions 50 and 52 are chosen to approximate the width of the pumping stripe for sections 42 and 44 and the narrower dimension of mask portion 54 is chosen to be sufficiently narrow to achieve some degree of IID substantially into if not throughout its active region portion beneath the mask but sufficiently wide such that its active region central core is not substantially dispersed by the IID process as compared to adjacent wing regions of the same active region 64 outside this central core region and not directly beneath mask portion 54.

Structure 40 is, next, returned to the MO-CVD reactor for the deposition of a bilayer composite source (not shown) over the established mask pattern portions 50, 52 and 54 and exposed portions of cap layer 68. As previously indicated, the bilayer composite source comprises an impurity source layer, e.g., polycrystalline Si, heavily doped with a diffusion enabling agent, e.g., As, followed by a passivating layer, which may, for example, be of the same material as the mask layer, i.e., Si$_3$N$_4$.

Figure 12:
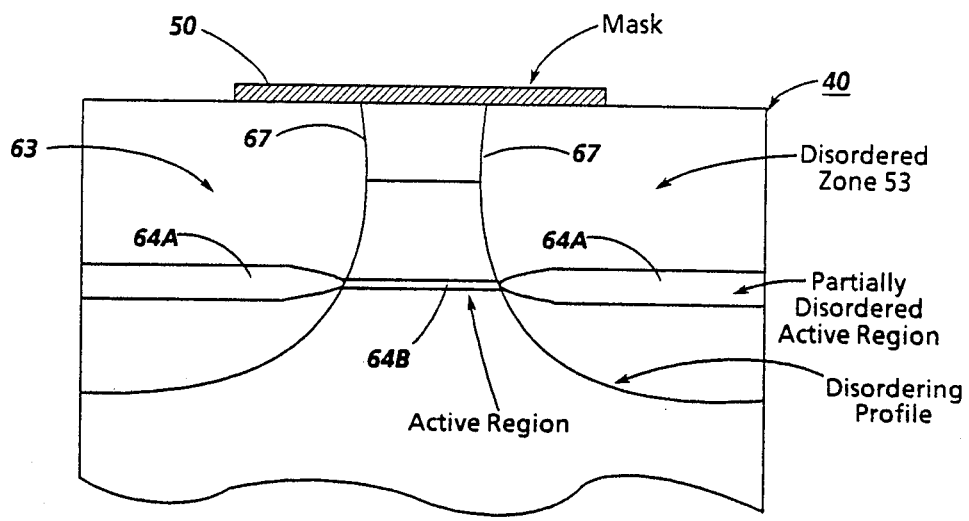
FIG. 12 is a cross sectional schematic representation of the diffusion profile along the lines 12—12 in FIG. 11 after selective IID treatment.
Figure 13:
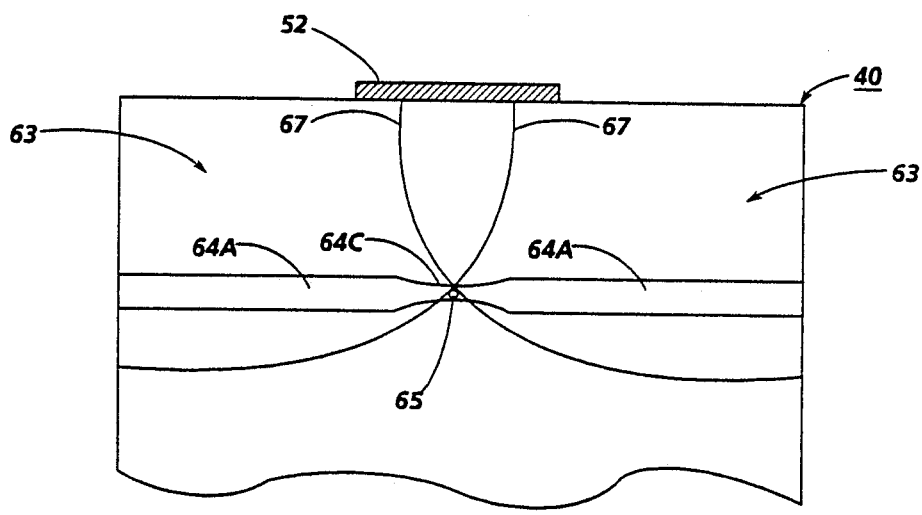
FIG. 13 is a cross sectional schematic representation of the diffusion profile along the line 13—13 in FIG. 11 after selective IID treatment.

Upon growth of the bilayer composite source, structure 40 is removed from the MO-CVD reactor and placed in a heat treating oven to perform an anneal, e.g. for a period of 8–10 hours at 850° C., to bring about selective disordering of structure 40, the progression or extent of which is illustrated by disordering profile 67 in FIGS. 12 and 13. The cross sectional representation of FIG. 12 is equally applicable to both amplifier section 42 and modulator section 44. As previously indicated, character and extent of profile 67 beneath each mask pattern portion 50, 52 and 54 is not only a function of the width of mask portion but also of the thickness and distance of depth of the underlying diffused layers and the temperature and time of annealing. Thus, the diffusion gradient profile 67 reepresents the extent of the ordered/disordered gradients that has occurred during the annealing process. Regions 64A represent, for example, the extent of sufficient Si concentration, i.e., [Si], having reached a predetermined level to provide an enhanced rate of interdiffusion of Ga and Al atoms among the heterostructure layers. Active region 64B remains undisturbed, i.e., not disordered, while region 64C is partially disordered. As a result, this region has compositional cross sectional, topographical profiles like those illustrated in FIGS. 5 and 8 so that the highest refractive index is at core 65 of waveguide region 64C and decreases in index value in all radial directions from core 65. As a result, core 65 functions as the center of a two dimensional waveguide in region 64C.

Thus, for the formation of waveguide region 64C, the lateral Si diffusion gradient profiles 67 from beneath both sides of nitride mask 52 are allowed to merge and at least initially pinch off active region 64. This results in the introduction of some elemental Al into core 65 of waveguide region 64C and thereby slightly increases the energy bandgap of the original active region 64 directly beneath mask 52 in the plane of this as-grown active region. The interdiffusion there will not be as extensive as in the areas where there is no nitride mask. However, because it takes longer for Si diffusion profile 67 to extend beneath the center of mask 52, less extensive interdiffusion directly beneath mask 52 results in a local maximum in the gallium composition of the alloy at a point directly beneath the center of mask. As a result, there is a maximum in refractive index at core 65, yielding a two dimensional waveguide that is automatically co-axial with original active region 64B. Waveguide region 64C is, therefore, low in absorption at the emission wavelength corresponding to radiative transitions in the quantum wells of region 64B. Proton bombardment isolation of waveguide section 46 is employed to insure that current is injected only in the regions of the crystal that contain as-grown active region 64B and waveguide region 64C not electrically pumped.

Figure 10:
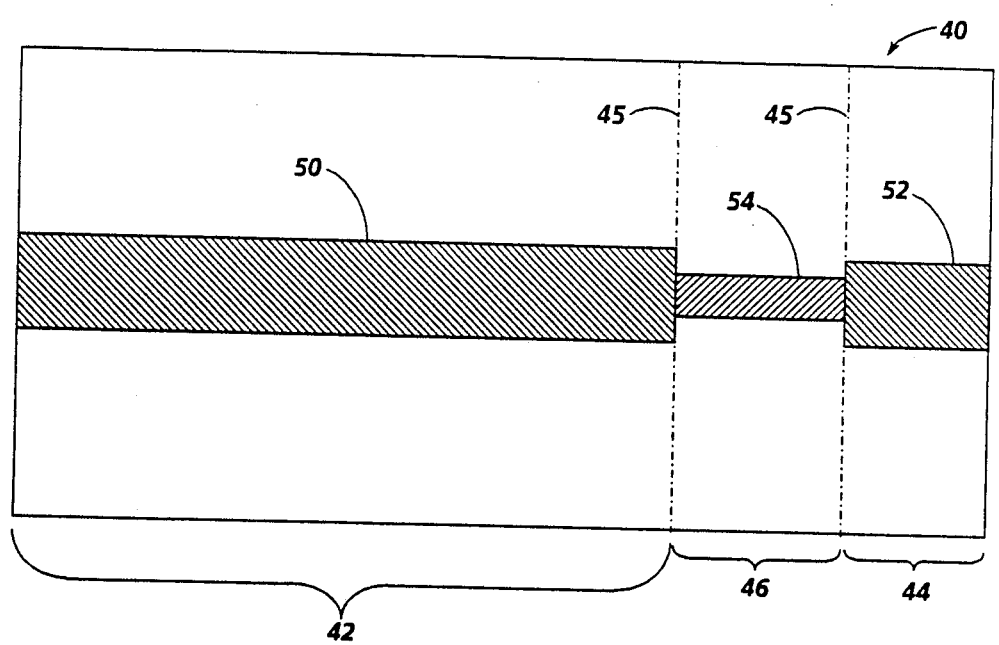
FIG. 10 is a schematic elevation of a monolithic laser/modulator of this invention after selective IID treatment.

By employing this type of waveguide section 46 to optically couple two sections 42 and 44 each containing a buried heterostructure multiple quantum well (MQW) active regions 64B, a monolithically, co-axially aligned, integrated laser amplifier/modulator is realized. A key distinction between the amplifier and modulator sections 42 and 44 of device 40 is that amplifier section 42 is of much greater length. As shown in FIG. 10, separate contacting of sections 42 and 44 is achieved by a photolithographic liftoff process, as is known in the art, to produce metal contacts 70 and 72 at these respective regions. Also, a metal contact 74 is deposited on the bottom surface of substrate 60.

Figure 14:
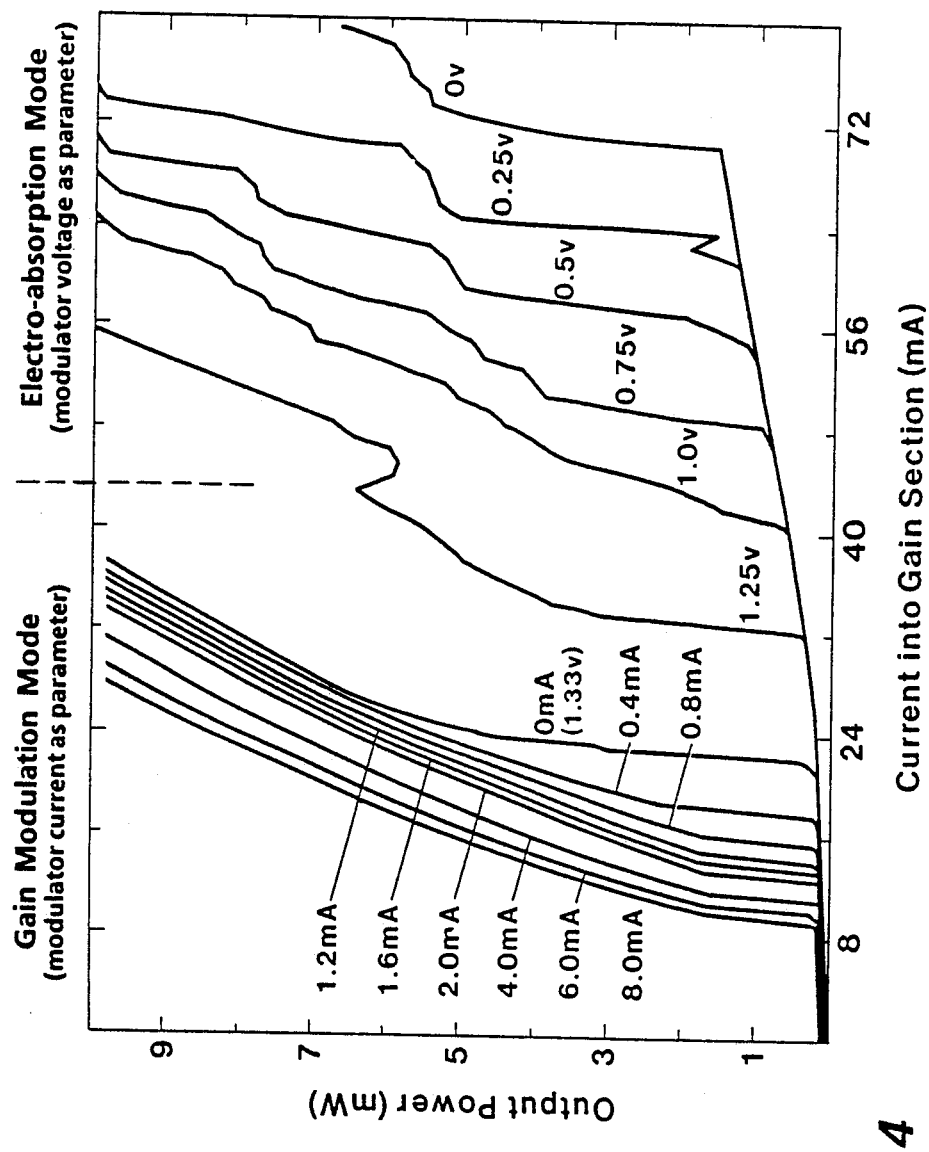
FIG. 14 is graphic illustration of the power versus current characteristics for different applied current and applied voltages to the monolithic laser/modulator of FIG. 11.

The modulation characteristics of several fabricated devices 40 were measured and the results indicate that there are two distinct regions of operation of device 40, as characterized by the power output versus current input curves of FIG. 14. The pulsed power output versus threshold curves are derived from currents and voltage biases applied to modulator section 44 and from power output measurements form the amplifier output facet. The curves in FIG. 14 correspond to two regions of operation, one with a negligible DC current on modulator section 44 as the voltage to modulator section 44 is varied between 0 and 1.25 v. This application is designated as the Electro-absorption Mode. Once the device begins to conduct significant current, the Gain Modulation Mode is entered where the DC voltage is largely constant and the current is varied from 0 mA to 8 mA. If modulator section 44 is sufficiently forward biased to conduct significant current, the modulation will be a result of changes in the simulated emission gain in modulator section 44 due to the changes in the carrier density in that region. This regime begins when the forward voltage reaches the turn-on voltage above which modulator 44 conducts more than a few tens of microamperes of current. In FIG. 14, the transition for this regime is approximately represented by 0 mA of current at 1.33 v of applied voltage bias. The 0 mA curve, however, actually corresponds to a few tens of microamperes of current and not absolute 0 mA. Further increments of modulator current from 0.4 mA to 8.0 mA result in incremental increase in optical power output. This region we refer to as the gain modulation region of the device. This mode of operation is very similar in dynamics to the modulation of a semiconductor laser biased above lasing threshold. In addition, this region is characterized by an initial very steep slope in power output versus current curve at threshold. This is believed to be a result of significant reflections, which are approximately 6%, that originate at active medium/passive waveguide transitions 45 in device 40, resulting in coupled cavity interference effects between the two high gain active regions 64B of active medium sections 42 and 44.

By decreasing the applied voltage below the value required for gain operation at modulator 44, very strong absorption effects occur in modulator section 44. i.e., section 44 functions to be nontransparent to radiation from section 42, resulting in a very strong dependence of the lasing threshold at amplifier section 42 on the value of the modulator voltage as demonstrated by the curves in the Electro-absorption Mode of FIG. 14. The modulation phenomenon in section 44 is electro-absorption in the multiple quantum well (MQW) of as-grown active region 64C wherein as the applied voltage is increased from 0 v to 1.25 v or more, section 44 becomes more transparent to and less absorbent of propagating radiation from section 42. Due to the presence of the p-n junction at MQW active region 64C, there exists an electric field across this region even at zero bias. As a forward bias is applied to the p-n junction, the magnitude of this electric field is decreased, thereby shifting the absorption band edge to shorter wavelengths, reducing the magnitude of the absorption at the laser wavelength. Thus, a decrease in lasing threshold is observed as the positive applied voltage bias is increased, as indicated by the curves in Electro-absorption Mode of FIG. 14. As a result of electro-absorption in modulator section 44, amplifier section 42 may be biased at values well above the "zero current" value without observing any lasing. This provides the advantage of a very high ratio to be achieved between the on and off states of modulator 44 with a very small applied voltage, and further, the on/off rate of section 42 can occur in very small picosecond periods. For example, with a DC bias of approximately 31 mA on amplifier section 44, the on/off ratio is easily in excess of 23:1, or 13:6 db, with an applied modulator voltage swing of approximately only 0 v to 1.35 v at less than one milliampere of current and optical switching occurs in less than 100 psec.

The amplifier/modulator combination device 40 will provide for ultra fast modulation due to the short time scale associated with electro-absorption effects, the lower capacitance of the short modulator section 44 relative to the total length of the optical cavity of structure 40 and the very high absorption obtained when modulator section 44 has no applied voltage bias. One major advantage of structure 40 is that it allows a convenient way of realizing very long lengths of electro-absorption, so that the modulation rate as a function of applied voltage to modulator section 44 is very large.

Figure 15A:
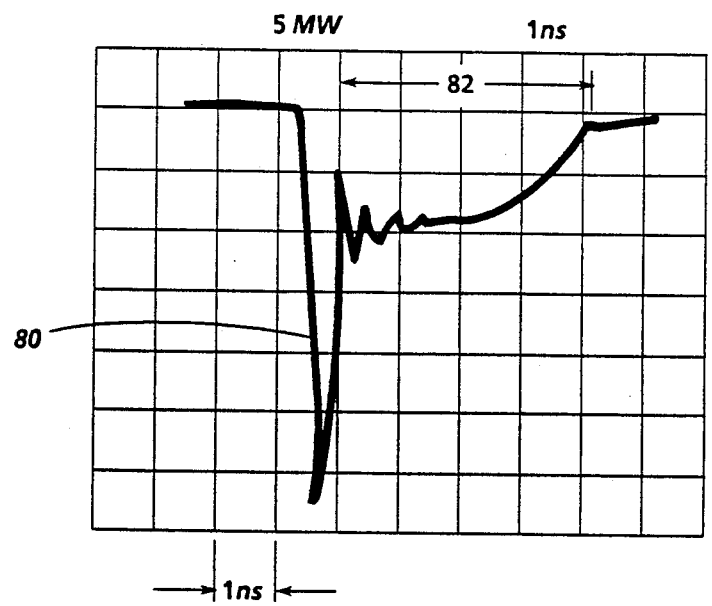
FIGS. 15A and 15B show the observed power output response for different current pulse inputs applied to the monolithic laser/modulator of FIG. 11.

This ultra fast modulation of device 40 has been observed under high speed pulsed operation in order to evaluate its modulation properties. By biasing laser section 42 to a constant DC current of 33 mA and applying a several nanosecond pulse to modulator section 44, an optical power output pulse of short duration from device 40 in the picosecond range is observed as can be seen in FIG. 14, at a current of 33 mA to gain section 42, a very small voltage change from 0 v to 1.25 v provides an output pulse of several mW at a very small change in current in the tens (10's) of μA range. In particular, FIG. 15A illustrates a light output pulse 80 for an input trigger current pulse of 8 ns duration with rise and fall times of 2 ns to 3 ns applied to modulator section 44. It should be noted that output pulse 80 has an initial rise time dramatically smaller in time compared to the rise time of the driving current pulse. Pulse 80 is of a large amplitude initial Q-switching pulse followed by a relaxation oscillation 82 that brings the amplitude of the pulse down to its steady state level as shown in FIG. 15A.

Figure 15B:
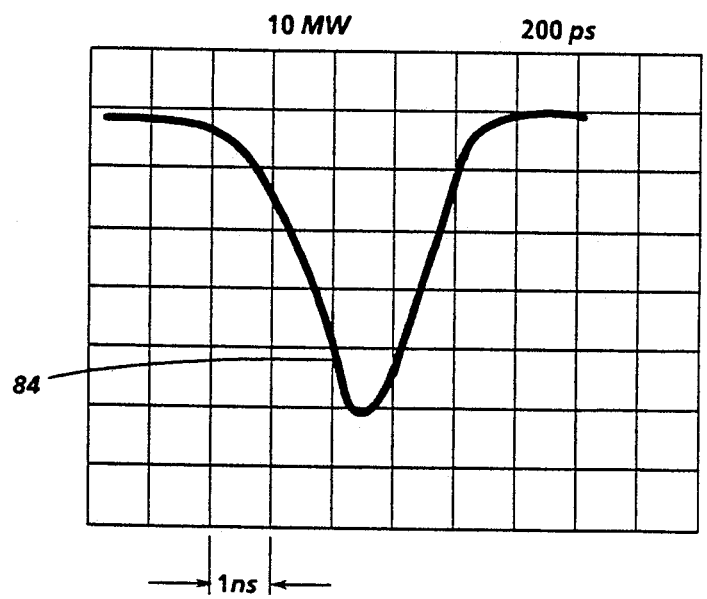

In FIG. 15B, the amplitude of the 8 ns modulator driving pulse has been reduced so that only a large Q-switched pulse is observed. As a result, power output pulse 84 with a less than 200 ps FWHM is obtained. Thus, a 8 ns input current pulse to modulator section 44 provides a very short light output pulse of 200 ps FWHM. The actual pulse width is significantly narrower than 200 ps, as the photodetector used had a rise time of 93 ps. The peak output power of pulse 84 is about 25 mW.

Another interesting and important aspect of structure 40 is that section 44 may be operated as an optical detector to detect radiation generated at gain section 42 and propagating through passive waveguide section 46. In performing this function, section 44 is operated in the Electro-absorption Mode.

In conclusion, low loss optical passive waveguides, such as region 42C, fabricated by impurity induced disordering provide subsurface semiconductor structures that are easily made coplanar and co-axial with buried gain operated regions that exhibit relatively low propagation loss at the wavelength of operation of the gain region or regions. Also, waveguide performance indicates that extended regions of unpumped optical cavity forming the two dimensional waveguides of this invention is accomplished without a major increase in lasing threshold or decrease in device efficiency. Also, relative to amplifier/modulator combination device 40, observed operation of modulator section 44 in both a gain modulation mode and an electro-absorption modulation mode demonstrates that by introducing or withdrawing the strong electro-absorption effect in modulator section 44, device 40 will operate in a Q-switched mode with pulse width responses below 200 ps.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A monolithic two dimensional waveguide coupled cavity laser/modulator structure comprising a plurality of semiconductor layers on a semiconductor substrate, one of said semiconductor layers having a narrower bandgap than at least immediately adjacent layers, a first active medium formed in a first region of said structure including a portion of said narrower bandgap layer and having a two dimensional optical cavity, a second active medium formed in a second region of said structure including a portion of said narrower bandgap layer and having a two dimensional optical cavity in coaxial alignment with the two dimensional optical cavity of said first active medium, one of said active mediums functioning as a laser and the other of said active mediums functioning as a modulator, a passive two dimensional waveguide integrally formed between and to said active mediums and having the highest refractive index at its core with diminishing refractive index omnidirectionally from its core, said two dimensional waveguide core having a energy bandgap level higher than both of said active mediums with low optical absorption at the gain wavelength of either of said active mediums.

2. The monolithic two dimensional waveguide coupled cavity laser/modulator structure of claim 1 wherein said active mediums are functionally operative in accordance with the optical output power versus current characteristics for said laser as a function of modulator voltage or modulator current wherein said structure operates in a gain modulation mode when the current applied to said modulator is above zero mA and operates in an electro-absorption mode when the voltage applied to said modulator is above zero volts.

3. The monolithic two dimensional waveguide coupled cavity laser/modulator structure of claim 1 which includes means to operate said modulator between an electro-absorption mode and a gain modulation mode through which said laser is current pumped above threshold, the modulated optical switching of the output of said laser in said electro-absorption mode being less than 100 picoseconds as a function of applied voltage to said modulator varied in a range of 0 to 2 volts.

4. The monolithic two dimensional waveguide coupled cavity laser/modulator structure of claim 1 wherein said active mediums and said integrally coupled passive two dimensional waveguide are formed by impurity induced disordering.

* * * * *